United States Patent
Kim et al.

(10) Patent No.: US 8,946,696 B2
(45) Date of Patent: Feb. 3, 2015

(54) ORGANIC LIGHT EMITTING DISPLAY

(71) Applicant: Samsung Display Co., Ltd., Yongin (KR)

(72) Inventors: Gee-Bum Kim, Yongin (KR); Min Woo Kim, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 14/019,673

(22) Filed: Sep. 6, 2013

(65) Prior Publication Data

US 2014/0167005 A1   Jun. 19, 2014

(30) Foreign Application Priority Data

Dec. 18, 2012  (KR) .................. 10-2012-0148789

(51) Int. Cl.
*H01L 51/00* (2006.01)
*H01L 27/32* (2006.01)
*H01L 51/52* (2006.01)

(52) U.S. Cl.
CPC .......... *H01L 27/322* (2013.01); *H01L 51/5265* (2013.01); *H01L 51/5271* (2013.01); *H01L 51/5218* (2013.01); *H01L 51/5234* (2013.01); *H01L 27/3206* (2013.01); *H01L 2251/5315* (2013.01)
USPC ................................ 257/40; 257/59; 257/72

(58) Field of Classification Search
CPC .............. H01L 27/322; H01L 51/5218; H01L 51/5265; H01L 51/5271
USPC ................................................ 257/40, 59, 72
See application file for complete search history.

(56) References Cited

U.S. PATENT DOCUMENTS

| 8,547,013 B2 * | 10/2013 | Okamoto et al. ............. 313/504 |
| 2006/0214573 A1 | 9/2006 | Maeda et al. |
| 2009/0261722 A1 | 10/2009 | Koo et al. |
| 2011/0260950 A1 | 10/2011 | Jung |

FOREIGN PATENT DOCUMENTS

| KR | 10 2002-0001864 A | 1/2002 |
| KR | 10 2006-0103112 A | 9/2006 |
| KR | 10-0909389 B1 | 7/2009 |
| KR | 10 2012-0097411 A | 9/2012 |

* cited by examiner

*Primary Examiner* — Tu-Tu Ho
(74) *Attorney, Agent, or Firm* — Lee & Morse, P.C.

(57) ABSTRACT

An organic light emitting display includes a thin film transistor substrate, and an organic light emitting device on the thin film transistor substrate, the organic light emitting device including a first electrode on the thin film transistor substrate, the first electrode being configured to reflect light, an organic layer on the first electrode and including at least an emitting layer, a transflective second electrode on the organic layer, and a color filter between the first electrode and the transflective second electrode.

20 Claims, 4 Drawing Sheets

ORGANIC LIGHT EMITTING DISPLAY

CROSS-REFERENCE TO RELATED APPLICATIONS

This U.S. non-provisional patent application claims priority under 35 U.S.C. §119 of Korean Patent Application No. 10-2012-0148789, filed on Dec. 18, 2012, in the Korean Intellectual Property Office, the entire contents of which are hereby incorporated by reference.

BACKGROUND

1. Field

The present disclosure herein relates to an organic light emitting display, and more particularly, to an organic light emitting display with enhanced color reproducibility.

2. Description of the Related Art

In general, an organic light emitting display is provided with a thin film transistor substrate, a counter substrate, and a plurality of organic light emitting devices disposed between the thin film transistor substrate and the counter substrate. Each of the plurality of organic light emitting devices has a structure in which an organic layer is disposed on an anode electrode, and a cathode electrode disposed on the organic layer.

In the organic light emitting device, holes and electrons are injected into the organic layer from the anode electrode and the cathode electrode and are recombined in the organic layer to generate excitons. When the excitons drop from an excited state to a ground state, energy is emitted in the form of light. The organic light emitting display is also provided with a color filter corresponding to each of the plurality of organic light emitting devices, and the color filters are generally disposed on one surface of the counter substrate.

SUMMARY

The present disclosure provides an organic light emitting display with enhanced color reproducibility.

Embodiments of the inventive concept provide an organic light emitting display including a thin film transistor substrate, a reflective layer on the thin film transistor substrate, a plurality of color filters on the reflective layer, the plurality of color filters including red, green, and blue color filters having different thicknesses, and a plurality of organic light emitting devices on respective color filters, each of the plurality of organic light emitting devices including a transparent first electrode on the color filter, an organic layer on the first electrode, the organic layer including at least an emitting layer, and a transflective second electrode on the organic layer.

A resonance distance of light emitted from the emitting layer of each of the plurality of organic light emitting devices may be equivalent to a distance between the reflective layer and a respective transflective second electrode.

The red color filter may have a greatest thickness among the plurality of color filters, and the blue color filter may have a smallest thickness among the plurality of color filters.

The light emitted from the emitting layer of the organic light emitting device corresponding to the red color filter may have a greatest resonance distance, and the light emitted from the emitting layer of the organic light emitting device corresponding to the blue color filter may have a smallest resonance distance.

A color of the light emitted from the emitting layer of each of the plurality of organic light emitting devices may be the same as that of a corresponding color filter.

The light emitted from the emitting layer may be white light.

The reflective layer may include at least one of Mo, MoW, Cr, Ag, APC (Ag—Pd—Cu alloy), Al, and Al alloys.

The organic light emitting display may further include a transparent encapsulating member on the organic light emitting device.

Embodiments of the inventive concept also provide an organic light emitting display including a thin film transistor substrate, a reflective layer on the thin film transistor substrate, and an organic light emitting device on the reflective layer, the organic light emitting device including a transparent first electrode on the reflective layer, an organic layer on the first electrode and including at least an emitting layer, a transflective second electrode on the organic layer, and a color filter between the transparent first electrode and the transflective second electrode.

The color filter may be conductive.

A resonance distance of light emitted from the emitting layer of the organic light emitting device may be equivalent to a distance between the reflective layer and the transflective second electrode.

A color of the light emitted from the organic layer may be the same as that of the color filter.

The organic light emitting display may further include a transparent encapsulating member on the organic light emitting device.

Embodiments of the inventive concept also provide an organic light emitting display including a thin film transistor substrate, and an organic light emitting device on the thin film transistor substrate, the organic light emitting device including a first electrode on the thin film transistor substrate, the first electrode being configured to reflect light, an organic layer on the first electrode and including at least an emitting layer, a transflective second electrode on the organic layer, and a color filter between the first electrode and the transflective second electrode.

The first electrode may include a reflective conductive layer and a transmissive conductive layer on the reflective conductive layer.

The first electrode may include one structure of ITO/Ag/ITO, ITO/Ag/IZO (Indium Zinc Oxide), ATD (ITO/Ag alloy/ITO), and ITO/APC (Ag—Pd—Cu alloy)/ITO.

The color filter may be conductive.

A resonance distance of light emitted from the emitting layer may be equivalent to a distance between the reflective layer and the transflective second electrode.

The organic light emitting display may further include a transparent encapsulating member on the organic light emitting device.

The color filter may be directly on the organic layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
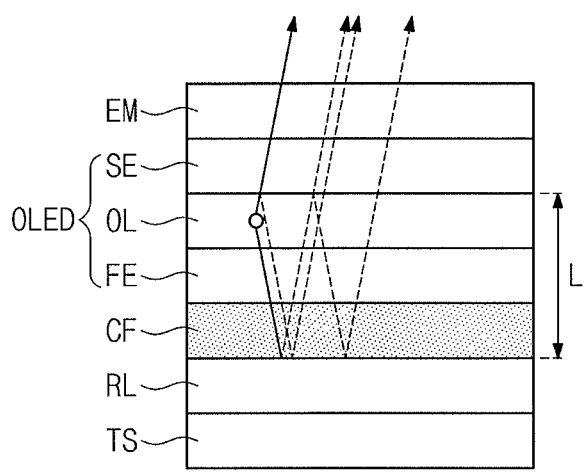
FIG. 1 is a cross-sectional view schematically illustrating an organic light emitting display according to an embodiment.

The present disclosure may be variously modified and may include various embodiments. However, particular embodiments are exemplarily illustrated in the drawings and will be described in detail. Example embodiments, however, are not limited to the particular forms disclosed. Example embodiments cover all modifications, equivalents, and alternatives falling within the spirit and scope of the inventive concept as defined by the claims.

In every possible case, like reference numerals or characters are used for referring to the same or similar elements in the description and drawings. In the drawings, the dimensions of structures may be exaggerated for clarity of illustration.

Relational terms such as 'first', 'second', and the like may be used for describing various elements, but the elements should not be limited by the terms. These terms are only used to distinguish one element from another. For example, an element referred as a first element in one embodiment may be referred to as a second element in another embodiment, and an element referred to as a second element in one embodiment may be referred to as a first element so long as this naming does not obscure the scope of the invention.

The meaning of "include", "comprise", "including", or "comprising" specifies a property, a figure, a process, an operation, a component, a part, or combinations thereof but does not exclude other properties, figures, processes, operations, components, parts, or combinations thereof. It will also be understood that when an element such as a layer, a film, a region, and a plate is referred to as being 'on' another element, it can be directly on the other element, or one or more intervening elements may also be present. Further, it will also be understood that when an element such as a layer, a film, a region, and a plate is referred to as being 'between' two elements, it can be directly between the two elements, or one or more intervening elements may also be present.

Hereinafter, exemplary embodiments will be described in detail with reference to the accompanying drawings.

FIG. 1 is a cross-sectional view schematically illustrating an organic light emitting display according to an embodiment.

Referring to FIG. 1, the organic light emitting display includes a thin film transistor substrate (TS), a reflective layer (RL) on the thin film transistor substrate (TS), a color filter (CF) on the reflective layer (RL), an organic light emitting device (OLED) on the color filter (CF), and a transparent encapsulating member (EM) on the organic light emitting device (OLED).

The thin film transistor substrate (TS) may include at least a drive element for driving the organic light emitting device (OLED), such as a thin film transistor (not illustrated). In more detail, the thin film transistor substrate (TS) includes a base substrate (not illustrated), a switching thin film transistor, a capacitor, and a drive thin film transistor which are disposed on the base substrate. The switching thin film transistor may be turned ON/OFF by an applied scan signal and may transmit an applied data signal to the capacitor and the drive thin film transistor. The drive thin film transistor determines the amount of current flowing into the organic light emitting device (OLED) according to the data signal transmitted through the switching thin film transistor. The capacitor stores the data signal transmitted through the switching thin film transistor. Also, the thin film transistor substrate (TS) may further include a passivation layer (not shown) covering the switching thin film transistor, the capacitor, and the drive thin film transistor.

The reflective layer (RL) reflects light emitted from the organic light emitting device (OLED), such that the reflected light is emitted toward the transparent encapsulating member (EM). Also, the reflective layer (RL) may include at least one of, e.g., Mo, MoW, Cr, Ag, APC (Ag—Pd—Cu alloys), Al, and Al alloys. The reflective layer (RL) may be electrically insulated from or electrically connected to the drive thin film transistor.

The color filter (CF) may be disposed, e.g., directly, between the reflective layer (RL) and the organic light emitting device (OLED). Also, the color filter (CF) may have one of red, green, and blue colors. The color filter (CF) may be electrically insulated from or electrically connected to the drive thin film transistor. For example, when the color filter (CF) is electrically connected to the drive thin film transistor, the color filter (CF) includes a conductive material and may provide the current flowing through the drive thin film transistor to the organic light emitting device (OLED).

The organic light emitting device (OLED) includes a first electrode (FE) on the color filter (CF), an organic layer (OL) on the first electrode (FE), and a second electrode (SE) on the organic layer (OL). Any one of the first electrode (FE) and the second electrode (SE) may be an anode electrode supplying holes to the organic layer (OL), and the other one may be a cathode electrode supplying electrons to the organic layer (OL). In this embodiment, a case where the first electrode (FE) is an anode electrode and the second electrode (SE) is a cathode electrode will be explained as one example.

The first electrode (FE) may include a transparent conductive oxide having a higher work function than the second electrode (SE). For example, the first electrode (FE) may include at least one of Indium Tin Oxide (ITO), Indium Zinc Oxide (IZO), Aluminum Zinc Oxide (AZO), Gallium doped Zinc Oxide (GZO), Zinc Tin Oxide (ZTO), Gallium Tin Oxide (GTO), and Fluorine doped Tin Oxide (FTO).

The second electrode (SE) may include a material having a lower work function than the first electrode (FE). For example, the second electrode (SE) may include at least one of Mo, W, Ag, Mg, Al, Pt, Pd, Au, Ni, Nd, Ir, Cr, Li, Ca, and alloys thereof, and may have a thickness adjusted to transmit light therethrough. Therefore, the second electrode (SE) may transmit some of the light incident thereon and may reflect some of the light incident thereon. Also, a transparent conductive layer (not shown) for preventing an IR-drop of the second electrode (SE) may be further provided on the second electrode (SE).

The organic layer (OL) may be provided with at least an emitting layer (EML) and may have a multilayered thin film structure. For example, the organic layer (OL) may include a hole injection layer (HIL) into which holes are injected, a hole transport layer (HTL) having excellent hole transportability and suppressing movement of electrons which are not coupled in the emitting layer (EML) to increase recombination opportunity of holes and electrons, the emitting layer (EML) emitting light by recombination of injected electrons and holes, a hole blocking layer (HBL) for suppressing movement of holes which are not coupled in the emitting layer (EML), an electron transport layer (ETL) for smoothly transporting electrons to the emitting layer (EML), and an electron injection layer (EIL) into which electrons are injected. The electrons and holes injected from the first electrode (FE) and the second electrode (SE) are recombined in the emitting layer (EML) to generate excitons and emit an emissive energy of the excitons in the form of light.

For example, the light generated in the emitting layer (EML) may be white light. In another example, the light generated in the emitting layer (EML) may be light having the same color as the color of the color filter (CF).

The transparent encapsulating member (EM) may be disposed on the second electrode (SE) to isolate the organic light emitting device (OLED) from an external environment. For example, the transparent encapsulating member (EM) may prevent oxygen or moisture in an external environment from penetrating into the organic light emitting device (OLED). The transparent encapsulating member (EM) may be, e.g., a transparent encapsulating glass or a capping layer. In the case where the transparent encapsulating member (EM) is a capping layer, the transparent encapsulating member (EM) may include a plurality of transparent insulating layers containing an organic substance or an inorganic substance.

Meanwhile, the light generated in the emitting layer (EML) of the organic light emitting device (OLED) may pass through the transparent encapsulating member (EM) via various paths. For example, some of the light generated in the emitting layer (EML) may pass through the second electrode (SE) and through the transparent encapsulating member (EM) to be emitted to the outside. The remainder of the light generated in the emitting layer (EML) may be reflected by the reflective layer (RL), pass through the color filter (CF), the first electrode (FE), the organic layer (OL), the second electrode (SE), and the transparent encapsulating member (EM) to then be emitted to the outside. This is seen, for example, by the solid arrow in FIG. 1.

In another example, some of the light which is generated in the emitting layer (EML) or reflected by the reflective layer (RL) toward the second electrode (SE) may pass through the second electrode (SE) and the transparent encapsulating member (EM) to be emitted to the outside. The remainder of the light generated in the emitting layer (EML) or reflected by the reflective layer (RL) toward the second electrode (SE) may be reflected by the second electrode (SE) back toward the reflective layer (RL). The light reflected by the reflective layer (RL) may pass through the color filter (CF), the first electrode (FE), the organic layer (OL), the second electrode (SE), and the transparent encapsulating member (EM) and then emitted to the outside. This is seen, for example, by the dashed arrows in FIG. 1.

That is, although some of the light generated in the emitting layer (EML) does not directly pass through the second electrode (SE), the light may be continuously reflected by the second electrode (SE) and the reflective layer (RL), and may pass through the second electrode (SE) when the light satisfies a constructive interference condition. A distance (L) between the reflective layer (RL) and the second electrode (SE) may be a resonance distance, i.e., where light generated in the emitting layer (EML) may resonate.

When it is assumed that a phase shift, i.e., generated when light generated in the emitting layer is reflected by the reflective layer (RL) and the second electrode (SE), is $\psi$ radian and a wavelength of light emitted from the organic light emitting device (OLED) is $\lambda$, the resonance distance (L) may satisfy Equation 1 below.

$$(2L)/\lambda + \psi/(2\pi) = m \quad \text{Equation 1}$$

In Equation 1, m is an integer. The resonance distance (L) may be changed according to the color of the color filter (CF), and may be determined by the thickness of the color filter (CF).

According to the above-described organic light emitting display, since the color filter (CF) is disposed adjacent to the organic light emitting device (OLED), light generated in the organic light emitting device (OLED) may be prevented from leaking. Also, since light of a wavelength band corresponding to the color of the color filter (CF) is extracted to an outside from the organic light emitting device (OLED) by the resonance distance (L), the color reproducibility of the organic light emitting display may be enhanced.

Hereinafter, other embodiments of the present disclosure will be described with reference to FIGS. 2 through 5. In FIGS. 2 through 5, like reference characters are used for referring to the same elements as those shown in FIG. 1. Also, in order to avoid repetition of the description, description will be made focusing on different features from those of FIG. 1.

Figure 2:
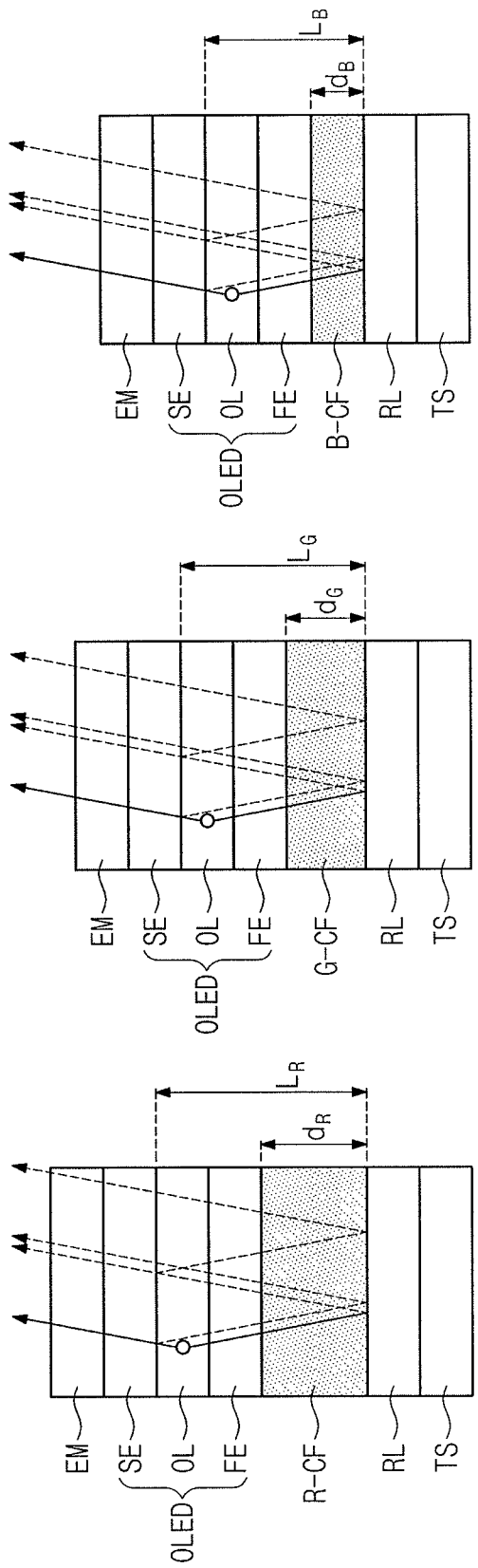
FIG. 2 is a cross-sectional view schematically illustrating an organic light emitting display according to another embodiment.

FIG. 2 is a cross-sectional view schematically illustrating an organic light emitting display according to another embodiment.

Referring to FIG. 2, the organic light emitting display includes a thin film transistor substrate (TS), a reflective layer (RL) on the thin film transistor substrate (TS), a plurality of color filters (R-CF, G-CF, B-CF), organic light emitting devices (OLEDs) on the plurality of color filters (R-CF, G-CF, B-CF), and a transparent encapsulating member (EM) on the organic light emitting devices (OLEDs).

The thin film transistor substrate (TS) may include a drive element for driving the organic light emitting devices (OLEDs). For example, the thin film transistor substrate (TS) may include a switching thin film transistor, a capacitor and a drive thin film transistor. The reflective layer (RL) reflects light emitted from the organic light emitting devices (OLEDs) such that the reflected light emits toward the transparent encapsulating member (EM). Also, the reflective layer (RL) may include at least one of Mo, MoW, Cr, Ag, APC (Ag—Pd—Cu alloys), Al and Al alloys.

The color filters (R-CF, G-CF, B-CF) are classified into a red color filter (R-CF), a green color filter (G-CF), and a blue color filter (B-CF), and each of the color filters (R-CF, G-CF, B-CF) corresponds to one of the plurality of organic light emitting devices (OLEDs). The red color filter (R-CF), the green color filter (G-CF), and the blue color filter (B-CF) may have thicknesses (dR, dG, dB) that are different from one another. For example, the red color filter (R-CF) may have the greatest thickness (dR) and the blue color filter (B-CF) may have the smallest thickness (dB).

The respective organic light emitting devices (OLEDs) are disposed on the corresponding color filters (R-CF, G-CF, B-CF). In more detail, each of the organic light emitting devices (OLEDs) includes a first electrode (FE) on the color filters (R-CF, G-CF, B-CF), an organic layer (OL) on the first electrode (FE), and a second electrode (SE) on the organic layer (OL).

For example, the first electrode (FE) may include at least one of Indium Tin Oxide (ITO), Indium Zinc Oxide (IZO), Aluminum Zinc Oxide (AZO), Gallium doped Zinc Oxide (GZO), Zinc Tin Oxide (ZTO), Gallium Tin Oxide (GTO), and Fluorine doped Tin Oxide (FTO). The second electrode (SE) may include at least one of, e.g., Mo, W, Ag, Mg, Al, Pt, Pd, Au, Ni, Nd, Ir, Cr, Li, Ca, and alloys thereof, and may have a thickness to such a degree that it may transmit light therethrough.

The organic layer (OL) may include at least an emitting layer (EML). The emitting layer (EML) generates excitons when electrons and holes injected from the first electrode (FE) and the second electrode (SE) are recombined therein, and emits an emissive energy of the excitons in the form of light. The light generated in the emitting layer (EML) may be white light. Otherwise, the light generated in the emitting layer (EML) may be light having the same colors as the colors of the color filters (R-CF, G-CF, B-CF).

The transparent encapsulating member (EM) may be disposed on the second electrode (SE) to isolate the organic light emitting device (OLED) from an external environment. For example, the transparent encapsulating member (EM) may prevent oxygen or moisture in an external environment from penetrating into the organic light emitting device (OLED).

Meanwhile, resonance distances ($L_R$, $L_G$, $L_B$) of lights generated in the emitting layers (EMLs) of the respective organic light emitting devices (OLEDs) may be distances between the reflective layer (RL) and the second electrodes (SE) of the respective organic light emitting devices (OLEDs). Then, since the thicknesses ($d_R$, $d_G$, $d_B$) of the color filters (R-CF, G-CF, B-CF) are different from one another, the resonance distances ($L_R$, $L_G$, $L_B$) of the lights generated in the emitting layers of the respective organic light emitting devices (OLEDs) may be different from one another.

For example, since the red color filter (R-CF) has the greatest thickness ($d_R$), the resonance distance ($L_R$) of the light generated in the emitting layer of the organic light emitting device (OLED) on the red color filter (R-CF) may be the greatest distance. Also, since the blue color filter (B-CF) has the smallest thickness ($d_B$), the resonance distance ($L_B$) of the light generated in the emitting layer of the organic light emitting device (OLED) on the blue color filter (B-CF) may be the smallest distance.

Figure 3:
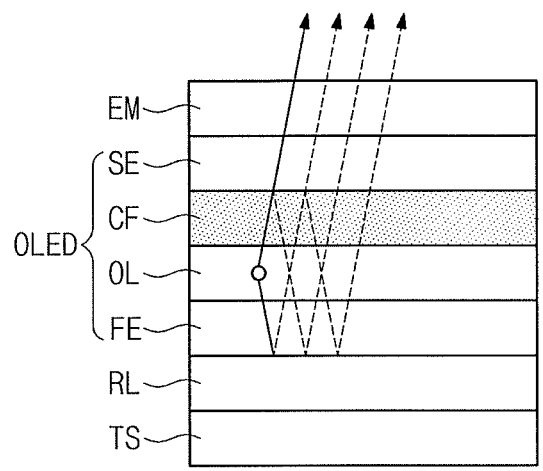
FIGS. 3 through 5 are cross-sectional views schematically illustrating organic light emitting displays according to still other embodiments.
Figure 4:
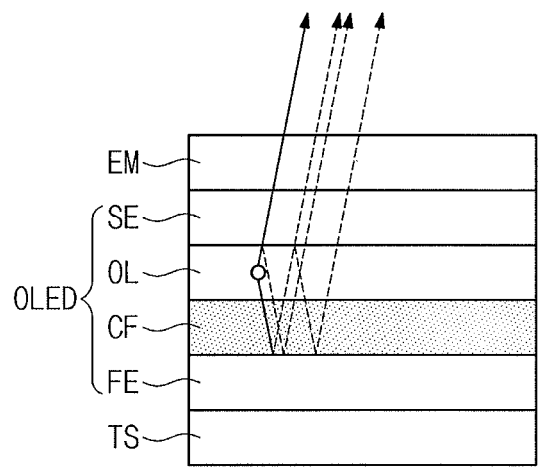
Figure 5:
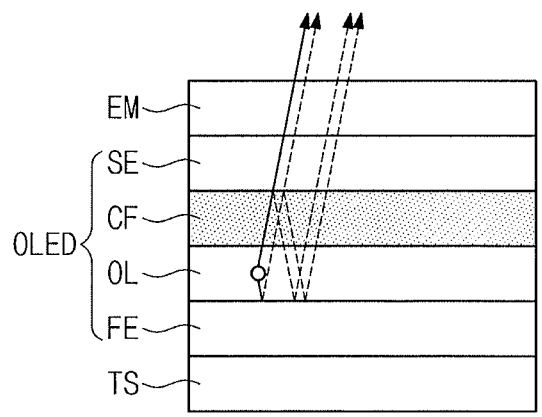

FIGS. 3 through 5 are cross-sectional views schematically illustrating organic light emitting displays according to still other embodiments.

Referring to FIGS. 3 to 5, the organic light emitting display includes a thin film transistor substrate (TS), an organic light emitting device (OLED) on the thin film transistor substrate (TS), and a transparent encapsulating member (EM) on the organic light emitting device (OLED).

The thin film transistor substrate (TS) may include a drive element for driving the organic light emitting devices (OLEDs). For example, the thin film transistor substrate (TS) may include a switching thin film transistor, a capacitor, and a drive thin film transistor.

The organic light emitting device (OLED) includes a first electrode (FE) on the thin film transistor (TS), an organic layer (OL) on the first electrode (FE), a second electrode (SE) on the organic layer (OL), and a color filter (CF) between the first and second electrodes (FE) and (SE). For example, the color filter (CF) may be between the first electrode (FE) and the organic layer (OL) or between the organic layer (OL) and the second electrode (SE). In other words, the color filter (CF) may be within the organic light emitting device (OLED), e.g., one of the internal layers of organic light emitting device (OLED). Herein, the color filter (CF) may have conductivity, e.g., includes a conductive material, so as not to impede the introduction of electrons or holes into the organic layer (OL).

Hereinafter, the organic light emitting display will be described in more detail.

First, the organic light emitting device illustrated in FIG. 3 may further include a reflective layer (RL) between the thin film transistor substrate (TS) and the organic light emitting device (OLED). The reflective layer (RL) reflects light emitted from the organic light emitting devices (OLEDs) such that the reflected light emits toward the transparent encapsulating member (EM). Also, the reflective layer (RL) may include at least one of, e.g., Mo, MoW, Cr, Ag, APC (Ag—Pd—Cu alloys), Al and Al alloys which are able to reflect light.

The organic light emitting device (OLED) may be disposed on the reflective layer (RL). Also, the color filter (CF) may be disposed between the organic layer (OL) and the second electrode (SE). Therefore, in the organic light emitting display of FIG. 3, a resonance distance of light generated in the emitting layer of the organic layer (OL) may be a distance between the reflective layer (RL) and the second electrode (SE).

Also, in the case of the organic light emitting displays illustrated in FIGS. 4 and 5, the first electrode (FE) of the organic light emitting device (OLED) may be a reflective electrode able to reflect light. For example, the first electrode (FE) may have a multilayered structure including a reflective conductive layer (not illustrated) capable of reflecting light generated in the organic layer (OL), and a transmissive conductive layer (not illustrated) containing a transparent conductive oxide having a higher work function than the second electrode (SE). For example, the first electrode (FE) may have a structure of one of ITO/Ag/ITO, ITO/Ag/IZO, ITO/Ag alloy/ITO (ATD), and ITO/Ag—Pd—Cu alloy (APC)/ITO. Therefore, in the organic light emitting displays of FIGS. 4 and 5, a resonance distance of light generated in the emitting layer of the organic layer (OL) may be a distance between the first electrode (FE) and the second electrode (SE).

According to the organic light emitting display of the example embodiments, since the color filter is disposed adjacent to the organic light emitting device, e.g., the color filter is in direct continuous contact with at least one layer of the organic light emitting device, light generated in the organic light emitting device may be prevented from leaking. Also, since light of a wavelength band corresponding to the color of the color filter is extracted to an outside from the organic light emitting device, the color reproducibility of the organic light emitting display may be enhanced.

In contrast, when a conventional organic light emitting display includes a color filter on a surface of a counter substrate, e.g., directly on a substrate of the organic light emitting display, light generated in the organic light emitting device may leak to a space between the color filter and the organic light emitting device. Thus, light emitted from the organic light emitting device has low color purity and low color reproducibility.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An organic light emitting display, comprising:
a thin film transistor substrate;
a reflective layer on the thin film transistor substrate;
a plurality of color filters on the reflective layer, the plurality of color filters including red, green, and blue color filters having different thicknesses; and
a plurality of organic light emitting devices on respective color filters, each of the plurality of organic light emitting devices including:
a transparent first electrode on the color filter,
an organic layer on the first electrode, the organic layer including at least an emitting layer, and
a transflective second electrode on the organic layer.

2. The organic light emitting display of claim 1, wherein a resonance distance of light emitted from the emitting layer of each of the plurality of organic light emitting devices is equivalent to a distance between the reflective layer and a respective transflective second electrode.

3. The organic light emitting display of claim 2, wherein the red color filter has a greatest thickness among the plurality of color filters, and the blue color filter has a smallest thickness among the plurality of color filters.

4. The organic light emitting display of claim 3, wherein the light emitted from the emitting layer of the organic light emitting device corresponding to the red color filter has a greatest resonance distance, and the light emitted from the emitting layer of the organic light emitting device corresponding to the blue color filter has a smallest resonance distance.

5. The organic light emitting display of claim 2, wherein a color of the light emitted from the emitting layer of each of the plurality of organic light emitting devices is the same as that of a corresponding color filter.

6. The organic light emitting display of claim 2, wherein the light emitted from the emitting layer is white light.

7. The organic light emitting display of claim 2, wherein the reflective layer includes at least one of Mo, MoW, Cr, Ag, APC (Ag—Pd—Cu alloy), Al, and Al alloys.

8. The organic light emitting display of claim 1, further comprising a transparent encapsulating member on the organic light emitting device.

9. An organic light emitting display, comprising:
a thin film transistor substrate;
a reflective layer on the thin film transistor substrate; and
an organic light emitting device on the reflective layer, the organic light emitting device including:
a transparent first electrode on the reflective layer,
an organic layer on the first electrode and including at least an emitting layer,
a transflective second electrode on the organic layer, and
a color filter between the transparent first electrode and the transflective second electrode.

10. The organic light emitting display of claim 9, wherein the color filter is conductive.

11. The organic light emitting display of claim 10, wherein a resonance distance of light emitted from the emitting layer of the organic light emitting device is equivalent to a distance between the reflective layer and the transflective second electrode.

12. The organic light emitting display of claim 11, wherein a color of the light emitted from the organic layer is the same as that of the color filter.

13. The organic light emitting display of claim 11, further comprising a transparent encapsulating member on the organic light emitting device.

14. An organic light emitting display, comprising:
a thin film transistor substrate; and
an organic light emitting device on the thin film transistor substrate, the organic light emitting device including:
a first electrode on the thin film transistor substrate, the first electrode being configured to reflect light,
an organic layer on the first electrode and including at least an emitting layer,
a transflective second electrode on the organic layer, and
a color filter between the first electrode and the transflective second electrode.

15. The organic light emitting display of claim 14, wherein the first electrode includes a reflective conductive layer and a transmissive conductive layer on the reflective conductive layer.

16. The organic light emitting display of claim 15, wherein the first electrode includes one structure of ITO/Ag/ITO, ITO/Ag/IZO (Indium Zinc Oxide), ATD (ITO/Ag alloy/ITO), and ITO/APC (Ag—Pd—Cu alloy)/ITO.

17. The organic light emitting display of claim 15, wherein the color filter is conductive.

18. The organic light emitting display of claim 15, wherein a resonance distance of light emitted from the emitting layer is equivalent to a distance between the reflective layer and the transflective second electrode.

19. The organic light emitting display of claim 14, further comprising a transparent encapsulating member on the organic light emitting device.

20. The organic light emitting display of claim 14, wherein the color filter is directly on the organic layer.

* * * * *